United States Patent [19]
Matsumoto et al.

[11] Patent Number: 5,333,032
[45] Date of Patent: Jul. 26, 1994

[54] LOGIC DESIGN SYSTEM AND METHOD IN THE SAME

[75] Inventors: Noriko Matsumoto, Kyoto; Shoji Takaoka, Osaka; Masahiko Ueda, Osaka; Tamotsu Nishiyama, Osaka, all of Japan

[73] Assignee: Matsushita Electric Industrial Co., Ltd., Osaka, Japan

[21] Appl. No.: 667,987

[22] Filed: Mar. 12, 1991

[30] Foreign Application Priority Data

Aug. 20, 1990 [JP] Japan ................. 2-219249

[51] Int. Cl.⁵ ............................................ G06F 15/60
[52] U.S. Cl. ..................... 364/489; 364/488
[58] Field of Search ............... 364/488, 489, 490, 491

[56] References Cited

U.S. PATENT DOCUMENTS

| | | | |
|---|---|---|---|
| 4,263,651 | 4/1981 | Donath et al. | 364/491 |
| 4,698,760 | 10/1987 | Lembach et al. | 364/490 |
| 4,703,435 | 10/1987 | Darringer et al. | 364/489 |
| 4,970,664 | 11/1990 | Kaiser et al. | 364/488 |
| 5,031,111 | 7/1991 | Chao et al. | 364/491 |
| 5,038,294 | 8/1991 | Arakawa et al. | 364/491 |
| 5,067,091 | 11/1991 | Nakazawa et al. | 364/490 |

FOREIGN PATENT DOCUMENTS 59-168545 9/1984 Japan .

OTHER PUBLICATIONS

"Technology Adaptation in Logic Synthesis" by Joyner, Jr. et al., IEEE 23rd Design Automation Conf., 1986, pp. 94–100.

"A Rule-Based System for Optimizing Combinational Logic" by de Geus et al., IEEE Design & Test 1985, pp. 22–32.

"MIS: A Multiple-Level Logic Optimization System" by Brayton et al., IEEE Trans. on CAD, vol. CAD-6, No. 6, Nov. 1987, pp. 1062–1081.

"Hierarchical Logic Synthesis System for VLSI" by Matsumoto et al., IEEE Proceedings of ISCAS 1985, pp. 651–654.

"Timing Analysis for nMOS VLSI" by N. P. Jouppi, IEEE 20th Design Automation Conf., 1983, pp. 411–418.

"Timing Influenced Layout Design" by M. Burstein et al., IEEE 22nd Design Automation Conf., 1985, pp. 124–130.

Primary Examiner—Vincent N. Trans
Attorney, Agent, or Firm—Lowe, Price, LeBlanc & Becker

[57] ABSTRACT

In a system for transforming input circuit information into information of a logic circuit composed of actual elements, a schematic diagram of a logic circuit composed of actual elements is displayed. A timing check is executed on the displayed logic circuit. A delay adjustment portion of the displayed schematic diagram is designated. A timing adjustment is executed by the system on the designated delay adjustment portion, and thereby the logic circuit is transformed into a second logic circuit composed of actual elements.

6 Claims, 9 Drawing Sheets

LOGIC DESIGN SYSTEM AND METHOD IN THE SAME

BACKGROUND OF THE INVENTION

This invention generally relates to a designing of an integrated circuit (IC) or a large-scale integrated circuit (LSI), and specifically relates to a logic design system for transforming a logic circuit of imaginary elements into a logic circuit of actual elements, or transforming a logic circuit of actual elements into another logic circuit of actual elements. This invention also relates to a method used in such a logic design system.

Generally, a top-down technique is used in a designing of an LSI. In such a top-down technique, the details of required functions are first identified and then a structure corresponding to the required functions is written in a primitive logic circuit, and the primitive logic circuit is transformed into an actual, physical logic circuit composed of actual elements.

It is well-known that a designing of an LSI which is based on a top-down technique is realized by a computer-based designing system. The computer-based designing system transforms a description of functions by a higher computer language such as "Prolog" or "C" into a logic-element circuit level, and transforms the logic-element circuit level into an actual-element circuit level.

The collection of papers related to the lectures in National Meeting of Japanese Society of Information Processing, 1985, pages 1923-1926, shows a circuit transformation technology in which a logic circuit containing theoretical, hypothetical, or imaginary logic elements is transformed into a logic circuit composed of only actual logic elements. Specifically, a prior-art logic design system based on this circuit transformation technology prestores information of logic elements containing imaginary logic elements, and also information of the relations between the logic circuits and corresponding actual logic circuits. The latter information is called "circuit transformation information". When information of a logic circuit containing imaginary logic elements is inputted into the logic design system, the following processes are executed by the logic design system. The respective logic elements of the input logic circuit are collated with the prestored logic elements, and actual-element logic circuits are sequentially generated for the respective logic elements of the input logic circuit by referring to the circuit transformation information. The input logic element and its fan out are considered in the generation of a corresponding actual-element logic circuit.

The above-mentioned prior-art logic design system has the following problem. Since the transformation of each input logic element into a corresponding actual-element logic circuit is fixed, a circuit transformation can not be performed in consideration of an observation of the circuit structure synthesized thereby. Accordingly, a resultant of the actual-element logic circuits tends to be more redundant than that obtained by a skilled circuit designer.

This problem of the prior-art logic design system is resolved by a logic design system disclosed in Japanese published unexamined patent application 59-168545. The logic design system of Japanese patent application 59-168545 prestores information related to a skilled circuit designer's knowledge of optimizing a circuit transformation in dependence on conditions of connections of logic elements. A circuit transformation process is performed by referring to this knowledge base, and thus the optimization of the circuit transformation is realized.

The knowledge base has components which are provided in correspondence with respective logic elements containing imaginary logic elements. Each component of the knowledge base includes a combination of circuit transformation rules. Each circuit transformation rule has a condition part and a conclusion part. The condition part relates to conditions of connections in an input logic element. The conclusion part relates to circuit transformation operations corresponding to the condition part. During the execution of the circuit transformation process, with respect to an input logic element, the component of the knowledge base which corresponds to the input logic element is referred to. Subsequently, the circuit transformation rules forming the component of the knowledge base are successively analyzed by an interpreter, and conditions of connections in the input logic element are sequentially collated with the condition parts of the circuit transformation rules to find the condition part of the circuit transformation rule which matches with the conditions of the connections of the input logic element. Finally, the circuit transformation is performed in accordance with the conclusion part of the circuit transformation rule whose condition part matches with the conditions of the connections of the input logic element.

Most prior art technologies of designing a logic circuit do not consider the optimization of signal delay times in a finally-obtained actual-element circuit. Only a few of the prior art technologies consider the optimization of signal delay times. For example, a signal delay time is evaluated on the basis of the number of logic stages (logic levels) of logic elements in a logic circuit.

Technical Study Report, Vol. 87 No. 92 (1987), pages 9-16, in Japanese Society of Electronics, Information, and Communications, discloses an example of a prior art designing of a logic circuit which considers the optimization of a signal delay time in a finally-obtained actual-element circuit. In this prior art designing technique, during a circuit transformation, a signal delay time is considered by giving predicted delay times to logic elements respectively, and calculating the longest path among a register and input and output terminals in a logic circuit. Such a process of evaluating a delay time is started from an output terminal side. When the delay evaluating process is advanced to a given logic element, the sum of the longest path from the given logic element to the output terminal and the predicted longest path from the input terminal to the given logic element is calculated, and the calculated sum is compared with a designated value. If the calculated sum exceeds the designated value, the related circuit transformation is not adopted.

The previously-mentioned prior art technologies have problems as follows. In the prior art technologies, during a circuit transformation, a signal delay time is evaluated on the basis of the number of logic stages .(logic levels) or the sum of predicted delay times given to respective logic elements, and the accuracy of the evaluation tends to be low since the logic stages (logic levels) and the logic elements are different from actual circuit elements. Further, in the prior art designing of the previously-mentioned Technical Study Report, since a process of evaluating a signal delay time is started from an output terminal side, it is generally difficult to execute a global optimization of a signal delay time which takes the whole of a circuit structure into consideration. Therefore, in some cases, a finally-obtained logic circuit is not optimal in a signal delay time.

Logic design systems according to the prior art technologies can not consider timing conditions determined by factors such as a setup time and a hold time of registers. Therefore, in the prior art logic design systems, an optimization of timing conditions has only an object of decreasing a signal delay by the longest path in a logic circuit, and it is difficult to execute an optimization of timing conditions in a sequential logic circuit. Further, the prior art logic design systems lack a function of correcting an error of timing conditions which is found during the check of the timing conditions in a finally-obtained actual-element circuit.

SUMMARY OF THE INVENTION

It is a first object of this invention to provide an improved logic design system.

It is a second object of this invention to provide an improved method used in a logic design system.

According to a first aspect of this invention, a system for transforming input circuit information into information of a logic circuit composed of actual elements comprises display means for displaying a schematic diagram of a logic circuit composed of actual elements; timing check means for executing a timing check on the logic circuit displayed by the display means; designating means for designating a delay adjustment portion of the schematic diagram displayed by the display means; and timing adjustment means for executing a timing adjustment on the delay adjustment portion designated by the designating means, and thereby transforming the logic circuit into a second logic circuit composed of actual elements.

According to a second aspect of this invention, a method of transforming a logic circuit composed of actual elements so that timing conditions of the logic circuit will satisfy predetermined circuit timing restrictions, comprises the steps of displaying a schematic diagram of a logic circuit composed of actual elements; designating a delay adjustment portion of the displayed schematic diagram; detecting a signal flow path in the designated delay adjustment portion which does not satisfy the circuit timing restrictions; transforming a first combination of actual elements in and around the detected signal flow path into a first combination of imaginary elements; transforming the first combination of the imaginary elements into a second combination of imaginary elements to satisfy the circuit timing restrictions; and transforming the second combination of the imaginary elements into a second combination of actual elements.

According to a third aspect of this invention, a system for transforming input circuit information into information of a logic circuit composed of actual elements comprises predicting means for predicting information of a logic circuit composed of actual elements from information of a logic circuit composed of imaginary elements; timing check means for detecting a timing error in the actual-element logic circuit predicted by the predicting means, and for analyzing an error factor related to the detected timing error; and timing adjustment means for transforming the logic circuit composed of the imaginary elements on the basis of a result of said analyzing by the timing check means, and thereby executing a timing adjustment.

According to a fourth aspect of this invention, a system comprises means for displaying a schematic diagram of a logic circuit composed of actual elements; means for evaluating a signal delay caused in at least a part of the logic circuit; means for deciding whether the evaluated signal delay is acceptable or unacceptable; and means for, when the deciding means decides the evaluated signal delay to be unacceptable, transforming a first combination of the actual elements in the part of the logic circuit into a second combination of actual elements.

DESCRIPTION OF THE FIRST PREFERRED EMBODIMENT

Figure 1:
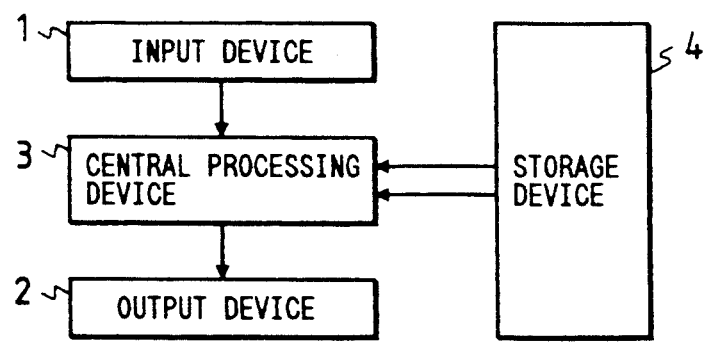
FIG. 1 is a block diagram of a logic design system according to a first embodiment of this invention.

With reference to FIG. 1, a logic design system includes an input device 1, an output device 2, a central processing device 3, and a storage device 4. The input device 1, the output device 2, and the storage device 4 are connected to the central processing device 3.

The input device 1 is used for inputting information into the central processing device 3. The input information includes information related to a circuit such as a logic circuit which is an object to be exposed to a circuit transformation, and also information related to a description of functions by a higher computer language such as "Prolog" or "C". The central processing device 3 processes the input information and executes a circuit transformation process to obtain information or data representative of a target circuit in accordance with various programs stored in the storage device 4. The target circuit has the same functions as the functions of the input transformation-object circuit, and is composed of actual elements. The output device 2 is used for outputting the information of the target circuit which is obtained by the central processing device 3.

The input device 1 includes a suitable device such as a card reader, a schematic entry system, or a file. The output device 2 includes a suitable device such as a graphic display. The output device 2 may be composed of a plotter or a file. The central processing device 3 includes a suitable device such as a general purpose computer, an engineering work station, or a personal computer.

Figure 2:
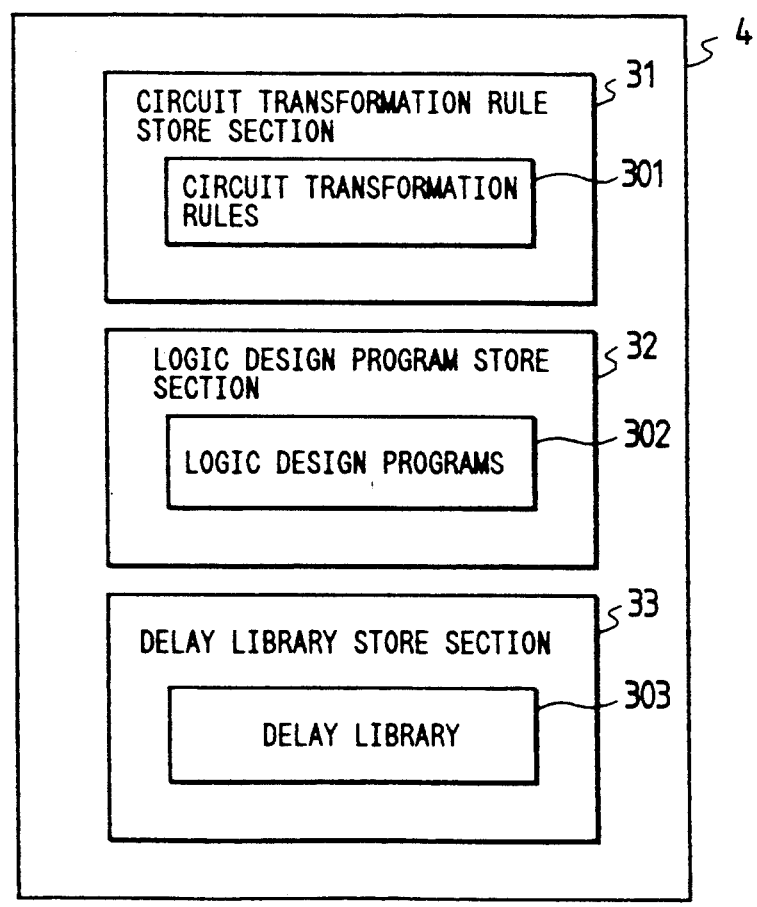
FIG. 2 is a diagram of the storage device of FIG. 1.

As shown in FIG. 2, the storage device 4 includes sections 31, 32, and 33. The section 31 stores information related to circuit transformation rules 301 used for a circuit transformation. The section 32 stores logic design programs 302 used for executing a design of a logic circuit. The logic design programs 302 are generated on the basis of the circuit transformation rules 301 and already-existing programs described later. The section 33 stores a library 808 of information of signal delays which is used for a check of timing conditions of a logic circuit. The already-existing programs include various programs which are coded in a programming language such as "Prolog", "Lisp" or "C". Specifically, the already-existing programs include programs for executing various procedural processes of a logic circuit designing, various functions, calculations, and judgments used in the generation of the logic design programs 302.

Figure 3:
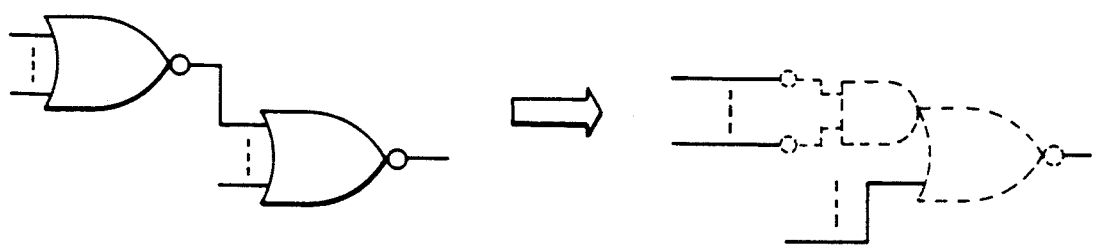
FIG. 3–5 are diagrams of examples of circuit transformation rules.
Figure 4:
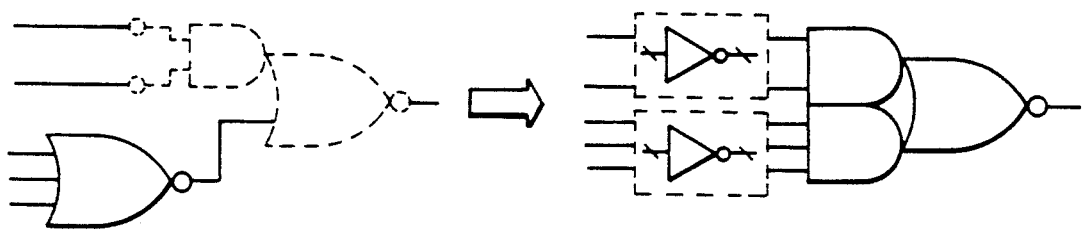
Figure 5:
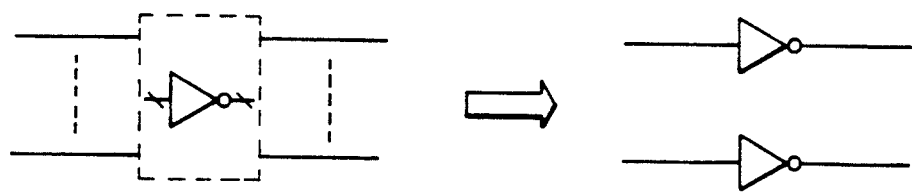

FIGS. 3-5 show examples of the circuit transformation rules 301 stored in the section 31 of the storage device 4. These examples are rules of an if-then type which are used for the transformation of a logic circuit containing imaginary logic elements into an actual logic circuit composed of only actual logic elements such as CMOS transistors and standard cells. The actual-element logic circuit is logically equivalent to the original logic circuit containing the imaginary logic elements.

FIG. 3 shows a main rule including a general rule that "if an output of a NOR gate having a fan out equal to 1 is connected with another NOR gate, then a rule for the transformation into a composite AND-NOR gate is applied".

FIG. 4 shows a sub rule including a rule for the transformation into a composite AND-NOR gate, or a local rule that "if the inputs of a 2-input NOR gate are connected with a 2-input NOR gate and a 3-input NOR gate respectively, then the transformation into standard cells antdO0 and inverter elements connected to respective inputs is performed". In FIG. 4, the inverter elements connected to the respective inputs are expressed by logic-inversion simplified macro elements (imaginary elements) having bit widths of 2 bits and 3 bits respectively.

FIG. 5 shows an expansion rule for expanding an imaginary macro element in actual elements, or a rule for transforming a logic-inversion macro element having a bit width of plurality of bits into actual inverters for the respective bits.

In some cases, the section 31 of the storage device 4 stores circuit transformation rules in the form of rule groups dependent on the types of the circuit transformation rules.

The circuit transformation rules include rules such as the previously-mentioned rules for the transformation between logic circuits and for the transformation of a logic circuit of imaginary elements into a logic circuit of only actual elements. In addition, the circuit transformation rules may include rules used in any stages of a logic circuit designing, such as rules for transforming a circuit expressed by a description of functions into a logic circuit, or rules for transforming a logic circuit of actual elements into another logic circuit of actual elements.

Figure 6:
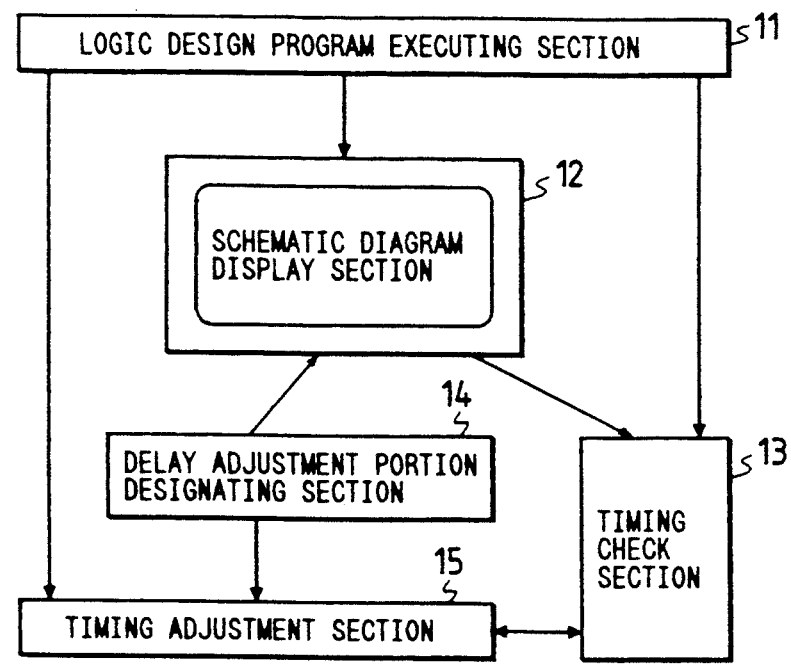
FIG. 6 is a function-separated diagram of the logic design system according to the first embodiment of this invention.

FIG. 6 is a function-separated diagram of the logic design system. As shown in FIG. 6, the logic design system includes a combination of sections 11, 12, 13, 14, and 15 separated in correspondence with different basic functions of the logic design system. The section 11 executes the logic design programs 302. The section 11 is formed by the central processing device 3 and the storage device 4 of FIG. 1. The result of the execution of the logic design programs 302 by the section 11 is information representing a logic circuit composed of actual logic elements. The logic circuit information is outputted from the section 11 to the section 12. The section 12 includes a graphic display which indicates a schematic diagram of the actual-element logic circuit represented by the information outputted from the section 11. The section 12 is formed by the output device 2 of FIG. 1. The section 13 checks timing conditions of the actual-element logic circuit indicated by the section 11. The timing conditions include various timing factors such as signal delays in signal flow paths in the actual-element logic circuit, and timings of signal reception by elements of the actual-element logic circuit. The section 13 is formed by the central processing device 3 and the storage device 4 of FIG. 1. By operating the section 14, the user designates a portion of the actual-element logic circuit indicated by the section 12, which is to be adjusted in a signal delay time, in consideration of the result of the timing check executed by the section 13. The section 14 is formed by the input device 1 of FIG. 1. The section 15 adjusts the timing conditions or the signal delay related to the portion of the actual-element logic circuit which is designated by operating the section 14, so that the timing conditions related to the whole of the actual logic circuit can be optimized. The section 15 is formed by the central processing device 3 and the storage device 4 of FIG. 1.

Figure 7:
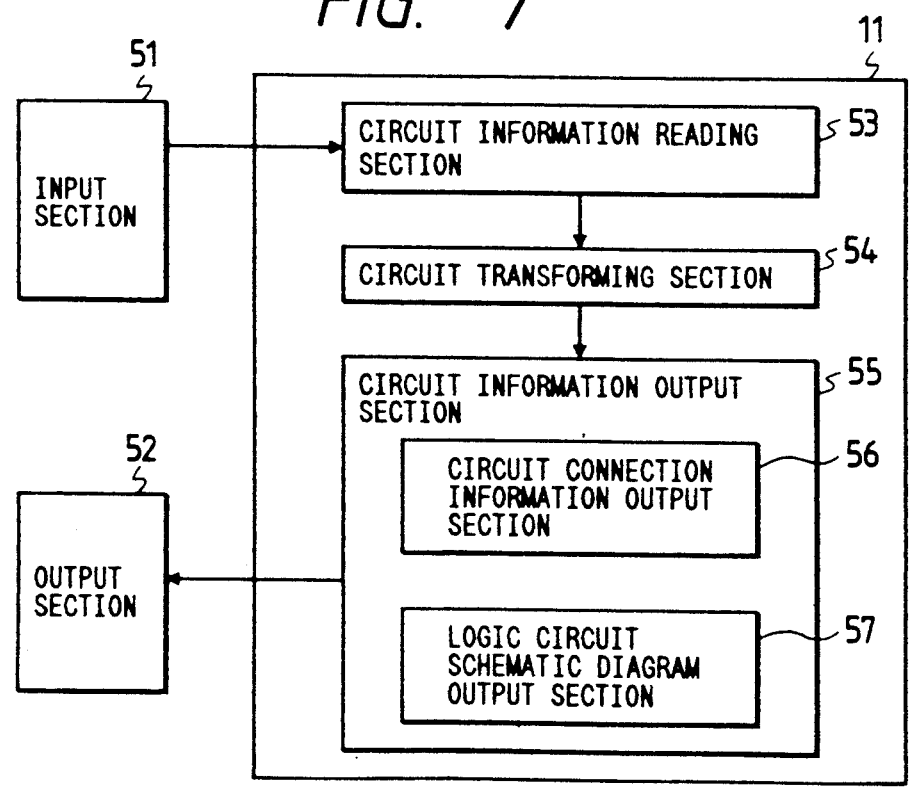
FIG. 7 is a diagram of the logic design program executing section, and related input and output sections in the logic design system according to the first embodiment of this invention.

As shown in FIG. 7, the logic design program executing section 11 includes sub-sections 53, 54, 55, 56, and 57. The sub-section 53 reads circuit information inputted from an input section 51 which corresponds to the input device 1 of FIG. 1. The input circuit information is transformed by the sub-section 54 into second circuit information representing a logic circuit composed of actual elements. The second circuit information is outputted by the sub-section 55 to an output section 52 which corresponds to the display section 12 of FIG. 6. The sub-section 55 is composed of the sub-sections 56 and 57. The sub-section 56 serves to output information of connections in the actual-element logic circuit to a suitable device such as a file. The sub-section 57 serves to generate information of a schematic diagram of the actual-element logic circuit on the basis of the information of the connections in the actual-element logic circuit, and to output the schematic diagram information to a display device.

Figure 8:
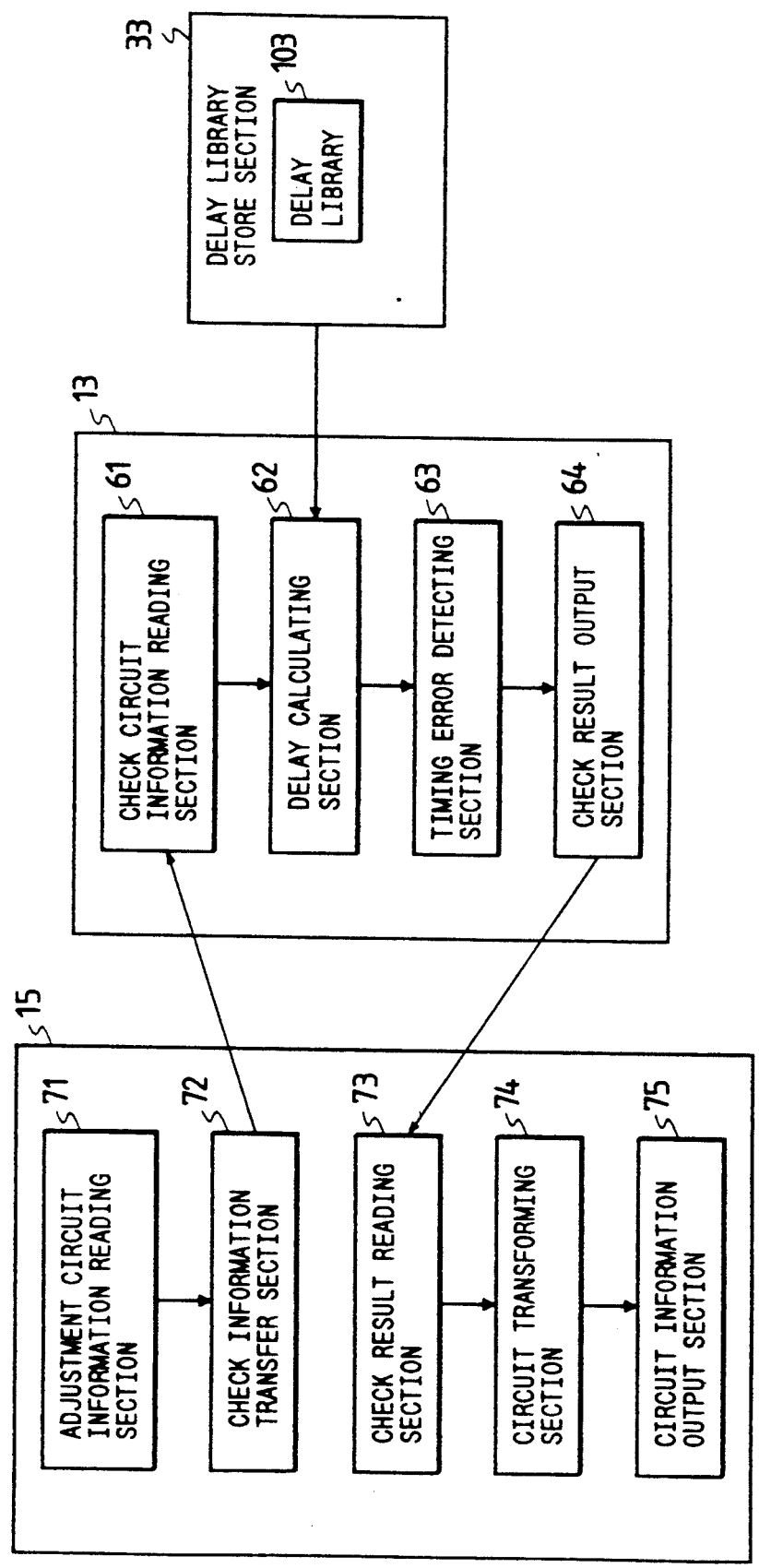
FIG. 8 is a diagram of the timing adjustment section, the timing check section, and a related section of the storage device in the logic design system according to the first embodiment of this invention.

As shown in FIG. 8, the timing check section 13 includes sub-sections 61, 62, 63, and 64, and the timing adjustment section 15 includes sub-sections 71, 72, 73, 74, and 75. The sub-section 71 of the timing adjustment section 15 reads information of an actual-element logic circuit being an object subjected to timing adjustment, and also reads information of the delay adjustment portion of the actual-element logic circuit which is designated via the designating section 14 of FIG. 6. The sub-section 72 of the timing adjustment section 15 feeds the circuit information and the designated portion information, which are read by the sub-section 71, to the sub-section 61 of the timing check section 13. The circuit information and the designated portion information are read by the sub-section 61 of the timing check section 13. The sub-section 62 of the timing check section 13 calculates a signal delay, which occurs in the designated portion of the actual-element logic circuit, from the circuit information and the designated portion information read by the sub-section 61, and the signal delay information 303 stored in the section 33 of the storage device 4 (see FIG. 4). In addition, the sub-section 62 detects and calculates the longest signal flow path and the shortest signal flow path in the designated portion of the actual-element logic circuit, and the lengths of the signal flow paths in the designated portion of the actual-element logic circuit. On the basis of the result of the calculation by the sub-section 62 and also predetermined circuit restrictions, the sub-section 63 of the timing check section 13 detects a signal flow path which does not satisfy the circuit restrictions. Such a signal flow path is detected as a timing error. The erroneous signal flow path detected by the sub-section 63, the path length calculated by the sub-section 62, and the type of the timing error detected by the sub-section 63 are outputted by the sub-section 64 as a timing check result. The timing check result is read by the sub-section 73 of the timing adjustment section 15. The sub-section 74 of the timing adjustment section 15 executes a transformation of the actual-element logic circuit in response to the timing check result read by the sub-section 73 for realizing a signal delay adjustment. Circuit information representing the result of the circuit transformation by the sub-section 74 is outputted by the sub-section 75 of the timing adjustment section 15. The execution of the timing check and the circuit transformation may be reiterated.

Figure 9:
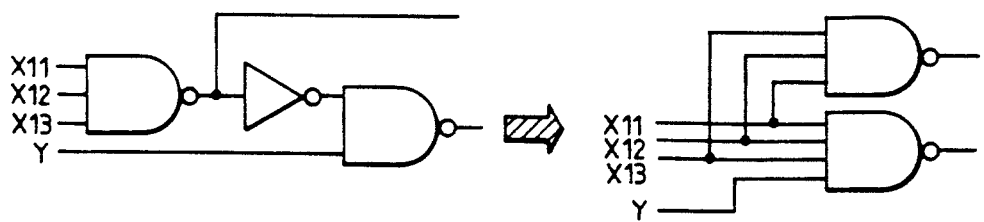
FIGS. 9–12 are diagrams of examples of delay-adjusting circuit transformation rules.
Figure 10:
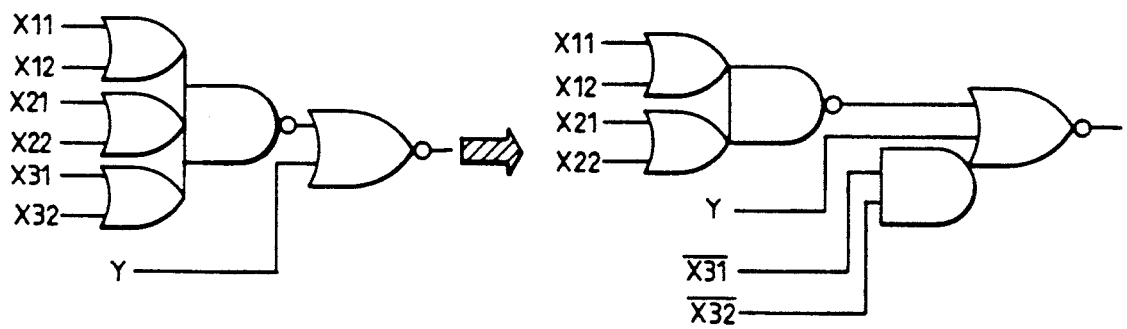
Figure 11:
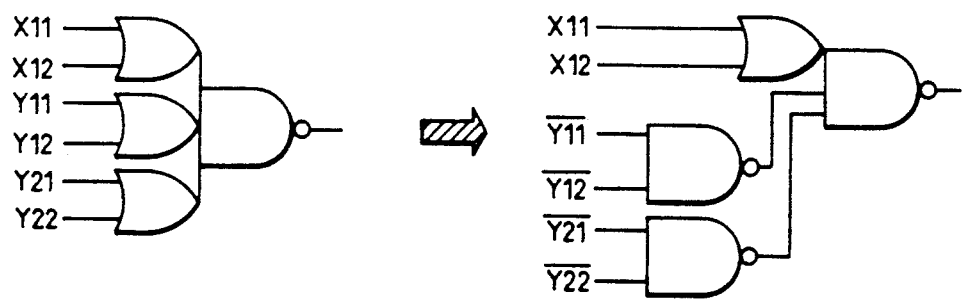
Figure 12:
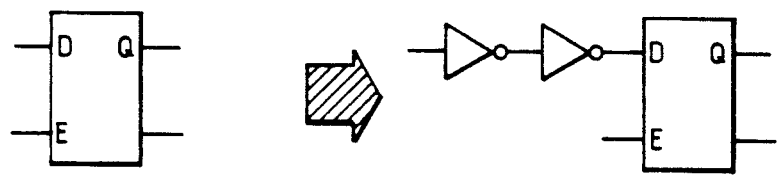

In special cases, the circuit transformation executed by the sub-section 74 of the timing adjustment section 15 in response to the timing check result is completed by replacing actual circuit elements with other actual circuit elements. In general cases, the circuit transformation is completed by transforming the erroneous portion of the actual-element logic circuit back into a corresponding imaginary-element logic circuit portion, transforming the imaginary-element logic circuit portion into an error-free imaginary-element logic circuit portion, and transforming the error-free imaginary-element logic circuit portion into a corresponding error-free actual-element logic circuit portion. The sub-section 74 of the timing adjustment section 15 executes the circuit transformation in response to the timing check result by the application of delay-adjusting circuit transformation rules. FIGS. 9–12 are diagrams of examples of these delay-adjusting circuit transformation rules. The rule of FIG. 9 is used to reduce a signal delay by changing logic elements in the longest signal flow path into parallelly-connected logic elements, and decreasing the number of the logic stages (logic levels) of the longest signal flow path. The rule of FIG. 10 is used to reduce a signal delay by changing a combination of composite logic gates in the longest signal flow path into another combination of composite logic gates, and decreasing the number of the logic stages (logic levels) of the longest signal flow path. The rule of FIG. 11 is used to reduce a signal delay by decreasing signal delays caused by logic elements in the longest signal flow path. The rule of FIG. 12 is used to remove a hold time error by adding delay elements to an input side of a register. These delay-adjusting circuit transformation rules are stored in the section 31 of the storage device 4 as a part of the circuit transformation rules 301. The execution of the circuit transformation by the sub-section 74 of the timing adjustment section 15 in response to the timing check result is controlled by the logic design programs 302.

While the circuit transformation based on the circuit transformation rules between the logic elements is described above with reference to FIGS. 9–12, the circuit transformation may be based on the gate development of a circuit structure expressed at a level of logic equations.

Figure 13:
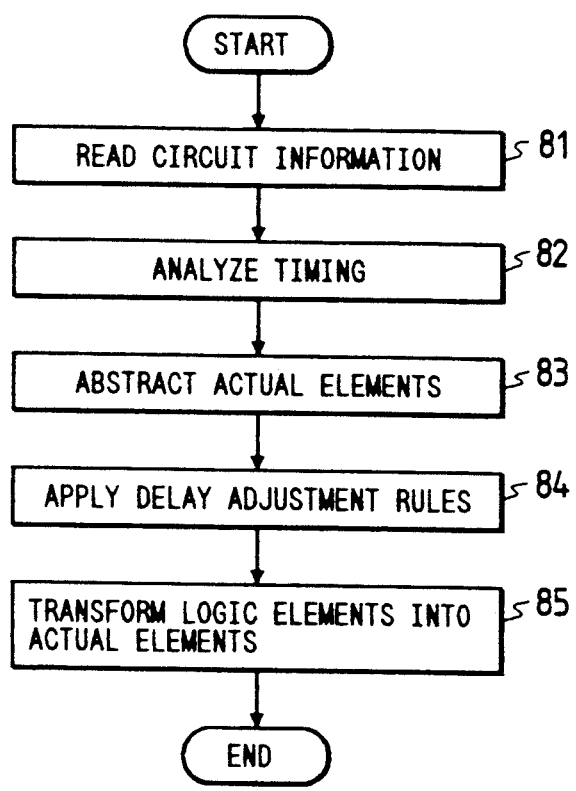
FIG. 13 is a flowchart of a timing adjustment program in the logic design system according to the first embodiment of this invention.

The timing adjustment executed by the timing adjustment section 15 of FIG. 6 is controlled by a timing adjustment program which is stored in the storage device 4 in a manner separate from the logic design programs 302 or as a part of the logic design programs 302. FIG. 13 is a flowchart of the timing adjustment program. A description will be given of the timing adjustment program of FIG. 13 with reference to an example related to reducing the signal delay in the longest signal flow path in a logic circuit. It should be noted that the removal of a hold time error or a setup time in a sequential logic circuit can be realized by processing similar to the processing in the reduction of the signal delay.

Figure 14:
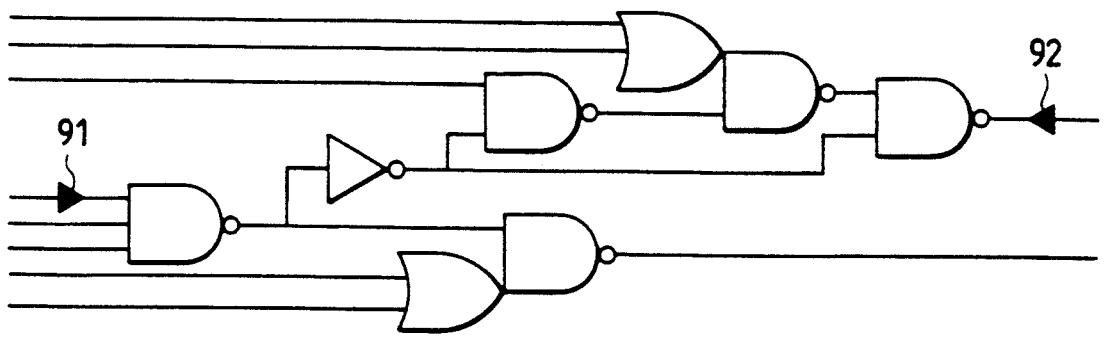
FIGS. 14–16 are schematic diagrams of examples of logic circuits which are indicated by a display device.

As shown in FIG. 13, at a first step 81 of the program, the sub-section 71 of the timing adjustment section 15 reads the circuit information of the schematic diagram indicated on the display section 12, and also reads the information related to the delay adjustment portion of the schematic diagram which is designated via the designating section 14. For example, the delay adjustment portion is designated by setting a start point 91 and an end point 92 of the delay adjustment portion on signal lines in the indicated schematic diagram as shown in FIG. 14. The delay adjustment portion may be designated by setting only a start point or an end point, or setting a plurality of start points or end points. Even in the case where an output terminal, an input terminal, or a register is chosen as the designated delay adjustment portion, the following processing remains basically unchanged.

Figure 15:
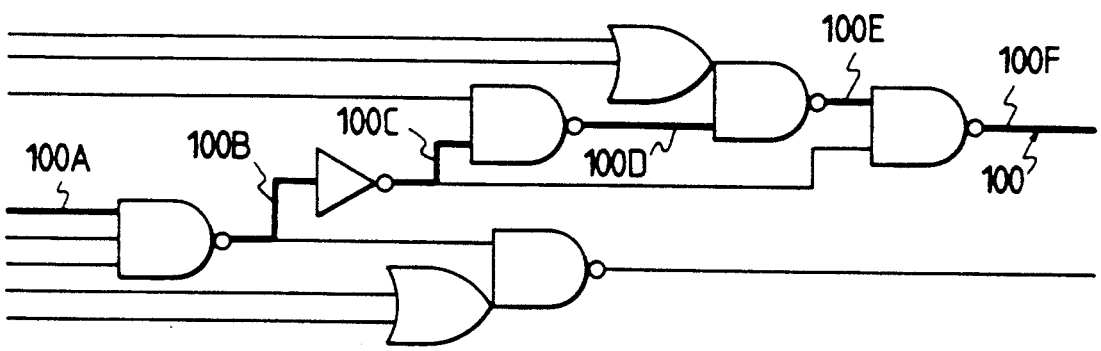

At a step 82 subsequent to the step 81, the sub-section 72 of the timing adjustment section 15 feeds the circuit information and the designated portion information read by the step 81 to the timing check section 13, enabling the timing check section 13 to execute the timing check and to detect the longest signal flow path in the designated portion of the logic circuit. FIG. 15 shows the longest signal flow path 100 detected by the timing check section 13 with respect to the timing adjustment portion designated as shown in FIG. 14. The detected longest signal flow path 100 has segments 100A–100F. The information representing the detected longest signal flow path 100 is outputted from the timing check section 13 as a timing check result. The timing check result is read by the sub-section 73 of the timing adjustment section 15.

Figure 16:
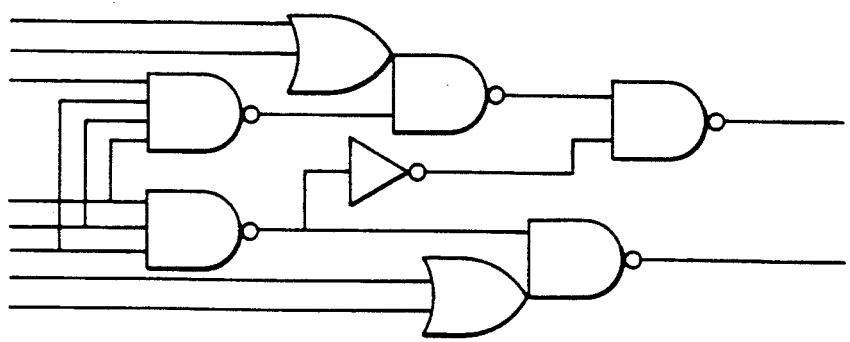

At a step 83 subsequent to the step 82, the sub-section 74 of the timing adjustment section 15 transforms a combination of the actual-level logic elements in and around the longest signal flow path into a combination of imaginary macro logic elements. At a step 84 subsequent to the step 83, the sub-section 74 of the timing adjustment section 15 executes a transformation of the portion of the circuit, which is composed of the imaginary macro logic elements, by the application of the delay-adjusting circuit transformation rules. In other words, the sub-section 74 transforms a first combination of imaginary macro logic elements into a second combination of imaginary macro logic elements in and around the longest signal flow path. The actual-level logic elements around the longest signal flow path include a group of first-stage elements connected to the start point and the end point of the longest signal flow path. The actual-level logic elements around the longest signal flow path may further include a group of later-stage elements. The accuracy of the timing adjustment increases in accordance with an increase in the stage number (level number) of the transformed elements around the longest signal flow path, that is, an increase in the number of the elements around the signal flow path which are subjected to the circuit transformation. At a step 85 subsequent to the step 84, the sub-section 74 of the timing adjustment section 15 transforms the second combination of the imaginary macro logic elements into a corresponding combination of actual-level logic elements. The circuit information related to the conversion-result circuit composed of the actual-level logic elements is outputted by the sub-section 75 of the timing adjustment section 15 to the file of the circuit connection information or the display section 12 to be indicated as a schematic diagram of an adjustment-result logic circuit. In the example of FIGS. 14 and 15, the circuit portion along the longest signal flow path 100 is subjected to the transformation of FIG. 9 and a resultant schematic diagram of FIG. 16 is outputted.

This embodiment features that the actual-level logic circuit is transformed to optimize the timing conditions of the actual-level logic circuit by use of the timing check section 13 as described previously. This feature of the embodiment produces the following advantages.

(1) Since the timing adjustment is executed while the timing conditions are observed on the schematic diagram of the logic circuit through the timing check, the timing adjustment can be accurate and easy.

(2) Since the timing adjustment is done with respect to only the circuit elements in and around the longest signal flow path in the designated circuit portion, the related search range is limited and the related circuit transformation can be quickly executed.

DESCRIPTION OF THE SECOND PREFERRED EMBODIMENT

Figure 17:
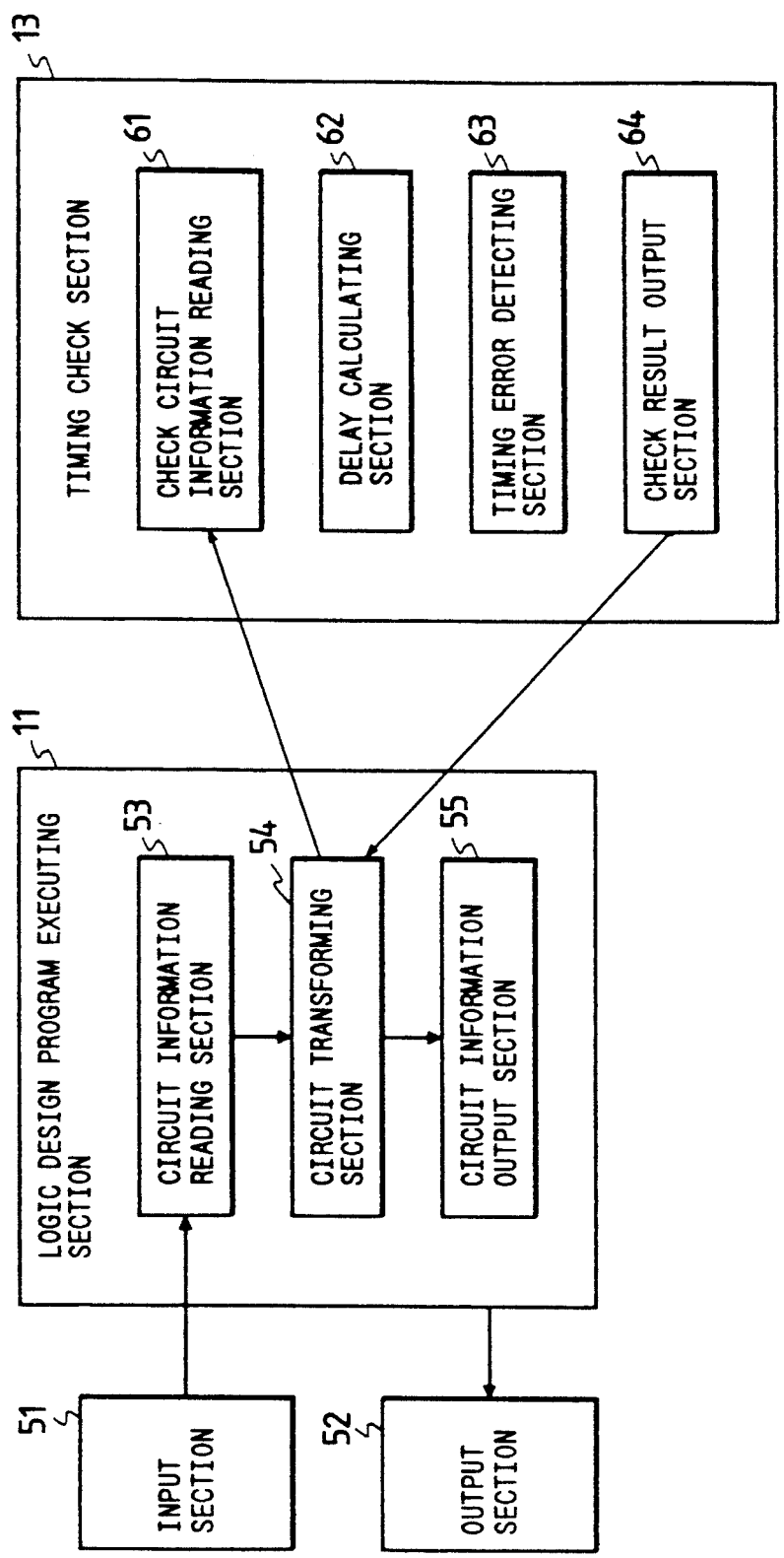
FIG. 17 is a function-separated diagram of a part of a logic design system according to a second embodiment of this invention.

FIG. 17 shows a part of a logic design system according to a second embodiment of this invention which is similar to the embodiment of FIGS. 1-16 except for design changes indicated later. The logic design system of this embodiment receives information of a logic circuit composed of imaginary macro logic elements, transforming the logic circuit composed of the imaginary macro logic elements into a logic circuit of actual-level elements, and outputting information of the logic circuit of the actual-level elements.

As shown in FIG. 17, the logic design system includes a section 11 for executing logic design programs, and a section 13 for executing a timing check. The logic design program executing section 11 includes sub-sections 53, 54, and 55. The sub-section 53 reads pieces of information inputted from an input section 51 which corresponds to an input device 1 of FIG. 1. The pieces of the information which are read by the sub-section 53 include information of a logic circuit composed of imaginary logic elements, and also information related to predetermined restrictions on timings in the logic circuit. The input circuit information is transformed by the sub-section 54 into second circuit information representing a logic circuit composed of actual elements to execute a desired circuit transformation. During the circuit transformation by the sub-section 54 of the section 11, the timing check section 13 decides whether or not timing conditions of the actual-element logic circuit satisfy the timing restrictions, and analyzes an error factor and detects a signal flow path which does not satisfy the timing restrictions. The circuit information composed of the result of the circuit transformation by the sub-section 54 is outputted by the sub-section 55 to an output section 52 which corresponds to an output device 2 of FIG. 1.

Figure 18:
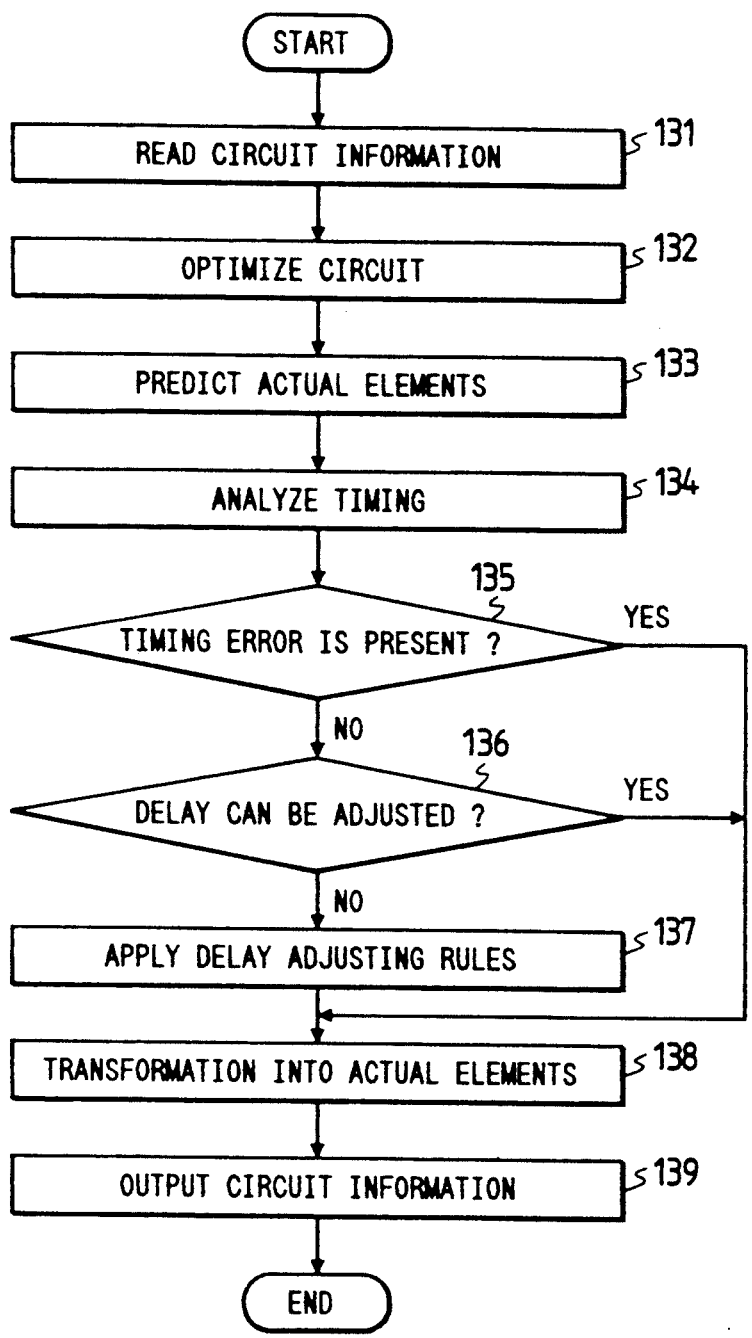
FIG. 18 is a flowchart of a program in the logic design system according to the second embodiment of this invention.

The timing check section 13 includes sub-sections 61, 62, 63, and 64 as in the embodiment of FIGS. 1-16. The operation of the circuit transformation sub-section 54 of the section 11 and the operation of the timing check section 13 are controlled in accordance with a program. FIG. 18 is a flowchart of this program.

As shown in FIG. 18, a first step 131 of the program reads the circuit information and the timing restrictions. A step 132 following the step 131 executes a circuit transformation with respect to the circuit information read by the preceding step 131 for a circuit optimization. It should be noted that the information of the logic circuit which is the result of the circuit transformation by the step 132 is not represented at a level of actual elements. A step 133 following the step 132 pre-reads information of a logic circuit composed of actual elements which is obtained by an actual-level circuit predicting part of the circuit transformation sub-section 54 of the section 11 on the basis of the circuit information of the result of the circuit transformation by the step 132.

A step 134 following the step 133 checks timing conditions of the actual-element logic circuit by use of the information of the actual logic circuit which is pre-read by the preceding step 133, and the timing restrictions read by the previous step 131. In addition, the step 134 detects a signal flow path which does not satisfy the timing restrictions, and also a timing error factor. A step 135 following the step 134 decides whether a timing error is present or absent. When a timing error is present, the program advances from the step 135 to a step 136. When a timing error is absent, the program jumps from the step 135 to a step 138. The operation of the step 135 is executed by the timing error detecting sub-section 63 of the timing check section 13. The step 136 decides whether or not the timing error can be corrected. When the timing error can be corrected, the program advances from the step 136 to a step 137. When the timing error can not be corrected, the program jumps from the step 136 to the step 138. At the step 137, a timing adjusting part of the circuit transformation sub-section 54 of the section 11 removes the timing error by applying delay adjusting rules to the circuit information of the result of the circuit transformation by the previous step 132, and thus executing an additional circuit transformation. The steps 132-137 are executed until all of timing errors are removed and a further delay adjustment becomes unnecessary. After the step 137, the program advances to the step 138. The step 138 transforms the error-free logic circuit into a logic circuit composed of actual elements. A final step 139 following the step 138 outputs the information of the result of the circuit transformation by the preceding step 139.

This embodiment features the automatic generation of an actual-element logic circuit which satisfies the predetermined circuit timing restrictions.

What is claimed is:

1. A circuit design apparatus for systematically transforming an input first logic circuit into a second logic circuit configuration of actual circuit elements, comprising:

display means for displaying a schematic diagram of a first logic circuit composed of circuit elements;

timing check means for executing a timing check on the first logic circuit displayed by the display means;

designating means for designating a delay adjustment portion of the schematic diagram displayed by the display means; and timing adjustment means operating responsively to the designating means for automatically executing a timing adjustment on the delay adjustment portion designated by the designating means, and thereby transforming the first logic circuit into a second logic circuit configuration of a plurality of actual circuit elements, input means for receiving said input first logic circuit, programmed central processing means including said timing check means, said designating means and said timing adjustment means, and storage means, said storage means including first storage for storing circuit transformation rules for use by the circuit design apparatus and said timing adjustment means, second storage for storing logic design programs, and third storage for storing a library of signal delays in said logic circuit of actual elements for use by said timing check means, wherein said timing adjustment means comprises:

first means for reading information from said storage means describing an actual circuit element logic circuit represented by said delay adjustment portion, second means for feeding the information read by said first means to said timing check means, third means for receiving timing check information from said timing check means pertaining to said delay adjustment portion, fourth means for transforming said actual circuit element logic circuit in response to said timing check information to obtain a timing adjustment therein, and fifth means for outputting information representing a transformed circuit provided by said fourth means, wherein said timing check means comprises:

first sub-means for receiving said information from said second means of said timing adjustment means, second sub-means for calculating a signal delay in a designated portion of said actual circuit element logic circuit of said delay adjustment portion based on delay information from said third storage of said storage means, and for calculating a longest signal flow path and a shortest signal flow path in said designated portion of said actual circuit element logic circuit, third sub-means for detecting a signal flow path failing to meet predetermined circuit restrictions, and fourth sub-means for outputting said timing check information to said third means of said timing adjustment means, said timing check information including a signal flow path detected by said third sub-means, a type of timing error represented thereby, and a path length calculated by said second sub-means for said signal flow path detected by said third sub-means.

2. The circuit design apparatus of claim 1, wherein said timing adjustment means includes reducing means for reducing a signal delay in a longest signal flow path by:

reading circuit information for the schematic diagram displayed on said display means and information identifying said delay adjustment portion designated by said designating means, for forwarding said information to said timing check means;

transforming actual-level logic circuit elements associated with a longest signal flow path calculated by said timing check means into a combination of theoretical macro logic elements;

transforming a portion of the logic circuit including said theoretical macro logic elements in accordance with predetermined delay adjustment circuit transformation rules; and transforming said portion of said logic circuit transformed in accordance with said predetermined delay adjustment circuit transformation rules to actual-level logic circuit elements.

3. The circuit design apparatus of claim 1, wherein:

said first means comprises means for reading circuit information for the schematic diagram displayed on said display means and information identifying said delay adjustment portion designated by said designating means, said second means comprises means for forwarding said information to said timing check means;

said fourth means comprises:

first transforming means for transforming actual-level logic circuit elements associated with a longest signal flow path calculated by said timing check means into a first combination of theoretical macro logic elements;

second transforming means for transforming a portion of the logic circuit including said theoretical macro logic elements to a second combination of theoretical macro logic elements in accordance with predetermined delay adjustment circuit transformation rules from said first storage; and third transforming means for transforming said second combination of theoretical macro logic elements to actual-level logic circuit elements, thereby reducing a signal delay in a longest signal flow path in said designated portion of said actual circuit element logic circuit.

4. A circuit design apparatus as recited in claim 11, further comprising:

predicting means for predicting information of a predicted second logic circuit configuration of actual circuit elements from an input first logic design of theoretical circuit elements;

said timing check means operating for detecting a timing error in the predicted second logic circuit configuration predicted by the predicting means, and for analyzing an error factor related to the detected timing error; and said timing adjustment means systematically transforming the first logic design of the theoretical circuit elements on the basis of a result of said analyzing by the timing check means, and thereby executing a timing adjustment.

5. The circuit design apparatus of claim 4 further comprising logic designating means for systematically generating a logic design for the second logic circuit configuration of actual circuit elements, said logic designing means being responsive to said timing adjustment means and executing said timing adjustment by automatically transforming the second logic circuit configuration having the detected timing error.

6. The circuit design apparatus of claim 1, further comprising logic designing means for automatically generating a logic design for the second logic circuit configuration composed of actual circuit elements, said logic designing means being responsive to said timing adjustment means by transforming the delay adjustment portion designated by the designating means in accordance with the timing adjustment executed by the timing adjustment means.

* * * * *